United States Patent [19]
Morimoto et al.

[11] Patent Number: 5,972,744
[45] Date of Patent: Oct. 26, 1999

[54] QUANTUM EFFECT DEVICE, METHOD OF MANUFACTURING THE SAME

[75] Inventors: Kiyoshi Morimoto, Osaka; Kiyoyuki Morita, Kyoto; Kiyoshi Araki, Osaka; Yoshihiko Hirai, Osaka; Koichiro Yuki, Osaka, all of Japan

[73] Assignee: Matsushita Electric Industrial Co., Ltd., Osaka, Japan

[21] Appl. No.: 09/037,016

[22] Filed: Mar. 9, 1998

Related U.S. Application Data

[62] Division of application No. 08/834,828, Apr. 3, 1997.

[30] Foreign Application Priority Data

Apr. 5, 1996 [JP] Japan .................................. 8-083675
Apr. 9, 1996 [JP] Japan .................................. 8-086176

[51] Int. Cl.$^6$ ................................................ H01L 21/70
[52] U.S. Cl. ........................... 438/197; 438/703; 257/14; 257/17
[58] Field of Search ........................ 257/14, 17; 438/197, 438/494, 172, 705, 703

[56] References Cited

U.S. PATENT DOCUMENTS 5,347,140  9/1994  Hirai et al. .................................. 257/17
5,618,760  4/1997  Soh et al. .................................. 438/703

Primary Examiner—Donald L. Monin, Jr.
Assistant Examiner—Douglas A. Wille
Attorney, Agent, or Firm—McDermott, Will & Emery

[57] ABSTRACT

A silicon island portion is formed in a quantum wire so as to be sandwiched between a pair of tunnel barrier portions of a silicon oxide film. On one side of the silicon island portion, a gate electrode for potential control is disposed with a gate insulating film of a silicon oxide film interposed therebetween. On the other side of the silicon island portion, a control electrode for potential control is disposed with an insulating film of a silicon oxide film interposed therebetween. Each of the tunnel barrier portions has a quantum wire constriction structure, which is formed by oxidizing a quantum wire, i.e., a silicon oxide film formed as a field enhanced oxide film with an atomic force microscope or the like, from its surface to a substantially center portion in its section.

6 Claims, 8 Drawing Sheets

("$V_{DD}$": n-type  
"0": p-type)

$T = 51.6\,(mK)$
$C_S = 1.0\,(aF)$
$C_D = 2.0\,(aF)$
$C_G = 1.0\,(aF)$
$C_{SUB} = 2.0\,(aF)$
$V_G = V_{DD} \times$ 5,972,744

QUANTUM EFFECT DEVICE, METHOD OF MANUFACTURING THE SAME

This is a divisional of application Ser. No. 08/834,828, filed Apr. 3, 1997.

BACKGROUND OF THE INVENTION

The present invention relates to a semiconductor device and a method of manufacturing the semiconductor device. More particularly, the invention relates to a quantum effect device and a method of manufacturing the quantum effect device, and a semiconductor device obtained by simplifying a binary decision diagram circuit including a single-electron tunneling transistor using semiconductor fine-lines, and a method of manufacturing the semiconductor device.

In these days, there is an increasing demand for decrease of power consumption of LSIs used in personal portable equipment. This is because the decrease of the power consumption of LSIs leads to decrease of power consumption of the entire portable equipment, resulting in elongating an operable time of the equipment driven by batteries. Therefore, the power consumption of a semiconductor device has definitely been decreased.

In a CMOS semiconductor device, which is recently mainly used as a semiconductor device, power consumption P is represented as $P = f \cdot C \cdot V^2$, wherein f indicates an operational frequency of a circuit, C indicates an equivalent capacitance of the entire circuit, and V indicates an operational supply voltage. Therefore, when the operational frequency f is constant, the equivalent capacitance C of the entire circuit and the operational supply voltage V are required to be decreased for the purpose of decreasing the power consumption P. The decrease of the capacitance and the operational voltage corresponds to decrease of the number of carriers to be moved.

Accordingly, in order to decrease the power consumption of a semiconductor device, it is necessary to decrease the number of carriers for transferring a signal. A single-electron tunneling device, which transfers a signal with a single electron, is regarded as an ultimate form for this purpose (Nakazato et: al., IEDM Tech. Digest, p. 487 (1992)). Such a single-electron tunneling device attracts attentions as the most promising device of a post-Si-VLSI. In accordance with the recent development of a fine-line processing technique, it has become possible to form a fine-line structure to the same extent as a wavelength of an electron. Various attempts have been made to express bit information with a device using several electrons and to construct a single-electron tunneling device by extending the present concept of a semiconductor device.

Now, a conventional four-terminal single-electron tunneling device will be described with reference to the accompanying drawings.

FIG. 9(a) is a schematic circuit diagram of a four-terminal single-electron tunneling device to be used in a conventional pseudo CMOS single-electron tunneling circuit (Tucker JR; J. Appl. Phys. 72, 4399 (1992)). As is shown in FIG. 9(a), the conventional four-terminal single-electron tunneling device includes a first tunnel junction 103 connected with a common node 101 at its one electrode and connected with a drain terminal 102 at its another electrode, a second tunnel junction 105 connected with the common node 101 at its one electrode and connected with a source terminal 104 at its another electrode, a first capacitor 107 connected with the common node 101 at its one electrode and connected with a gate terminal 106 at its another electrode, and a second capacitor 109 connected with the common node 101 at its one electrode and connected with a power terminal 108 at its another electrode.

The four-terminal single-electron tunneling device works, for example, as an n-type device when the power terminal 108 is set at a supply voltage VDD and the gate terminal 106 is used as a gate electrode, and as a p-type device when the power terminal 108 is grounded and the gate terminal 106 is used as a gate electrode. Accordingly, a combination of such n-type and p-type four-terminal single-electron tunneling devices can constitute a circuit equivalent to a CMOS circuit. FIG. 9(b) shows simulation results of the operation of the conventional four-terminal single-electron tunneling device, and reveals that a characteristic similar to the Vd-Id characteristic of a MOSFET can be obtained by this single-electron tunneling device.

However, although the conventional single-electron tunneling device transfers a signal with one electron and is regarded as one of the ultimate devices from a view point of the power consumption decrease, it has the following two problems:

The first problem arises in a processing technique. In the case where the device as shown in FIG. 9(a) is realized by using silicon, which is superior in mass-production and material stability, it is necessary to suppress the capacitance of the tunnel junction to be several aF (atto-farad; 1 aF=$10^{-18}$ F) as is shown in FIG. 9(b), and hence, a fine-line processing technique on a nm-level is indispensable. In the conventional manufacturing method for a quantum effect device using the electron beam lithography, a line width of approximately 10 nm is the minimum limit. Thus, it is disadvantageously difficult to form a device of several nm or smaller, which can exhibit a remarkable quantum effect. Also, when an electron beam is used, a process damage can be caused on the surface of a silicon substrate, which can disadvantageously degrade the characteristic of the device.

The second problem arises in a circuit technique. The single-electron tunneling device has a different operational mechanism from that of the CMOS technique, which is mainly used for conventional VLSIs, and theoretically has extremely small input and output voltages. Therefore, it is necessary to adopt, in the single-electron tunneling device, a different logical circuit technique from the conventional circuit technique. From this point of view, there is a proposal of forming a binary decision diagram circuit by using a single-electron tunneling transistor (Yoshihito Amamiya, et al., Oyo Butsuri, 64, No. 8, 765–768(1995)).

SUMMARY OF THE INVENTION

The present invention was devised to overcome the aforementioned problems, and the object is realizing a quantum effect device with small power consumption occupying a very small area.

In order to achieve the object, this invention adopts a damage-free process applying field enhanced oxidation using a scanning probe microscope and crystal anisotropic etching, which is adaptable to the conventional silicon semiconductor technique. Since a single-electron tunneling device has theoretically a very small input voltage and a very small output voltage, it is necessary to be coupled with another device in which a voltage amplitude can be enlarged. According to the present manufacturing method, a single-electron tunneling device can be easily and definitely coupled with a Si-CMOS device, which is mainly used at present.

The quantum effect device of this invention comprises a quantum wire of silicon; a pair of tunnel barrier portions formed in the quantum wire with a distance in a lengthwise direction of the quantum wire; a gate insulating film formed in an island portion of the quantum wire sandwiched between the pair of tunnel barrier portions; and a gate electrode formed on the gate insulating film of an opposite side to the island portion of the quantum wire.

According to this quantum effect device, a single-electron tunneling device to be used in a pseudo CMOS single-electron tunneling circuit can be definitely realized by using one end of the quantum wire as a source electrode and the other end as a drain electrode. Furthermore, a four-terminal single-electron tunneling device can be easily realized by providing, with an insulating film interposed, another gate electrode on the other side of the island portion opposite to the gate electrode. In this manner, a device with very small power consumption can be realized. In addition, the quantum effect device theoretically occupies an area with each side of several tens nm including the island portion, and hence can be very highly integrated.

The method of manufacturing a quantum effect device of this invention comprises the steps of forming a thin silicon layer by making an upper silicon layer on an SOI substrate thinner through etching of an entire main surface of the upper silicon layer; forming a first linear pattern of a field enhanced oxide film on the thin silicon layer by allowing a conductive tip to come close to a main surface of the thin silicon layer and effecting a field enhanced oxidation by scanning, with the conductive tip, the main surface of the thin silicon layer in a direction parallel to one side of the SOI substrate; forming, on the thin silicon layer, a second linear pattern of a field enhanced oxide film crossing the first linear pattern at a crossing portion by allowing the conductive tip to come close to a predetermined area in the first linear pattern and effecting the field enhanced oxidation by scanning, with the conductive tip, the main surface of the thin silicon layer in a direction vertical to the first linear pattern; forming a first quantum wire and a second quantum wire of silicon crossing each other at a crossing portion by effecting anisotropic etching on the thin silicon layer by using the first and second linear patterns as masks; after removing the first and second linear patterns, forming tunnel barriers of a field enhanced oxide film in first and second areas in the first quantum wire sandwiching the crossing portion by effecting the field enhanced oxidation with the conductive tip allowed to come successively close to the first and second areas; and forming insulating films of a field enhanced oxide film in third and fourth areas in the second quantum wire sandwiching the crossing portion by effecting the field enhanced oxidation with the conductive tip allowed to come successively close to the third and fourth areas.

According to the method of manufacturing a quantum effect device, a four-terminal single-electron tunneling device to be used in a pseudo CMOS single-electron tunneling circuit can be definitely realized by using one end of the first quantum fine line close to the first area as a source electrode, the other end close to the second area as a drain electrode, one end of the second quantum wire close to the third area as a first gate electrode, and the other end close to the fourth area as a second gate electrode.

The semiconductor device of this invention comprises a carrier transfer portion of silicon formed on an SOI substrate in a shape of an island; a first quantum wire of silicon formed on the SOI substrate and connected with one end of the carrier transfer portion with a first tunnel barrier interposed therebetween; a second quantum wire of silicon formed on the SOI substrate and connected with the other end of the carrier transfer portion with a second tunnel barrier interposed therebetween; a third quantum wire of silicon formed on the SOI substrate and connected with a part of the carrier transfer portion between the two ends thereof with a third tunnel barrier interposed therebetween; a first control electrode formed on the carrier transfer portion with an insulating film sandwiched therebetween; a second control electrode formed on the second quantum wire with an insulating film sandwiched therebetween; and a third control electrode formed on the third quantum wire with an insulating film sandwiched therebetween.

According to this semiconductor device, a binary decision diagram circuit can be easily and definitely realized as follows: The first quantum wire is used as an input terminal, the second quantum wire is used as a first output terminal, and the third quantum wire is used as a second output terminal. A carrier, which is input through the input terminal and transferred to the carrier transfer portion by applying a potential to the first control electrode formed on the carrier transfer portion with the insulating film interposed therebetween, can be output to the first or the second output terminal by applying a potential to the second control electrode formed on the second quantum wire with the insulating film sandwiched therebetween or to the third control electrode formed on the third quantum wire with the insulating film sandwiched therebetween.

In one aspect of the semiconductor device, each of the first, second and third tunnel barriers is preferably formed by quantum wire constriction in which a part of the corresponding quantum wire is made smaller in a section thereof as compared with the other parts. Thus, the first through third tunnel barriers can definitely work as tunnel barriers against a carrier as well as a carrier speed can be improved.

Alternatively, the method of manufacturing a semiconductor device of this invention comprises the steps of forming a thin silicon film by making an upper silicon layer on an SOI substrate thinner through etching of an entire main surface of the upper silicon layer; forming a first linear pattern of a field enhanced oxide film on the thin silicon layer by allowing a conductive tip to come close to a main surface of the thin silicon layer and effecting a field enhanced oxidation by scanning, with the conductive tip, the main surface of the thin silicon layer in a direction parallel to one side of the SOI substrate; forming, on the thin silicon layer, a second linear pattern of a field enhanced oxide film connected with the first linear pattern through a first branching portion by allowing the conductive tip to come close to a predetermined area in the first linear pattern and effecting the field enhanced oxidation by scanning, with the conductive tip, the main surface of the thin silicon layer in a direction vertical to the first linear pattern; forming, on the thin silicon layer, a third linear pattern of a field enhanced oxide film connected with the second linear pattern through a second branching portion by allowing the conductive tip to come close to a predetermined area in the second linear pattern and effecting the field enhanced oxidation by scanning, with the conductive tip, the main surface of the thin silicon layer in a direction vertical to the second linear pattern; forming a first quantum wire and a second quantum wire of silicon connected with each other through the first branching portion and a third quantum wire of silicon connected with the second quantum wire through the second branching portion by effecting anisotropic etching on the thin silicon layer by using the first, second and third linear patterns as masks; forming a first tunnel barrier of a field enhanced oxide film in a first area in the first quantum wire on one side of the first branching portion opposite to the third quantum wire by effecting the field enhanced oxidation with the conductive tip allowed to come close to the first area; forming a second tunnel barrier of a field enhance oxide film in a second area in the first quantum wire on the same side of the first branching portion as the third quantum wire by effecting the field enhanced oxidation with the conductive tip allowed to come close to the second area; forming a third tunnel barrier of a field enhanced oxide film in a third area in the second quantum wire on the same side of the second branching portion as the first branching portion by effecting the field enhanced oxidation with the conductive tip allowed to come close to the third area; forming a fourth tunnel barrier of a field enhanced oxide film in a fourth area in the third quantum wire on one side of the second branching portion by effecting the field enhanced oxidation with the conductive tip allowed to come close to the fourth area; depositing an interlayer insulating film on an entire surface of the SOI substrate; forming a first control electrode on the interlayer insulating film above the first branching portion; forming a second control electrode on the interlayer insulating film above a part of the first quantum wire on the same side of the second tunnel barrier as the third quantum wire and above the third quantum wire; and forming a third control electrode on the interlayer insulating film above the second branching portion.

According to this method of manufacturing a semiconductor device, a binary decision diagram circuit can be easily and definitely realized as follows: One end of the first quantum wire close to the first area is used as an input terminal, the other end close to the second area is used as a first output terminal, and the end of the third quantum wire is used as a second output terminal. A carrier, which is input through the input terminal and transferred to the first branching portion by applying a potential to the first control electrode formed above the first branching portion with the interlayer insulating film sandwiched therebetween, can be output to the first or the second output terminal by applying a potential to the second control electrode formed above the part of the first quantum wire on the same side of the second tunnel barrier as the third quantum wire and above the third quantum wire with the interlayer insulating film sandwiched therebetween or to the third control electrode formed above the second branching portion with the interlayer insulating film sandwiched therebetween.

In one aspect of the method for manufacturing a semiconductor device, each of the first, second, third and fourth tunnel barriers is preferably formed by completely oxidizing a section of the corresponding quantum wire. Thus, a leakage current in each of the quantum wires can be suppressed, and the cooling temperature of the semiconductor device can be comparatively high.

In another aspect of the method, each of the first, second, third and fourth tunnel barriers is preferably formed by partly oxidizing a section of the corresponding quantum wire. Thus, the tunnel barriers can be easily and definitely formed, and a carrier speed can be improved.

In still another aspect of the method, the thin silicon layer on the SOI substrate preferably has a thickness of 50 nm or less. Thus, each quantum wire can be definitely formed. In addition, when the thickness of the thin silicon layer is 2 nm through 10 nm, the section of the quantum wire can be easily completely oxidized. When the thickness is 10 nm through 50 nm, merely a part of the section of the quantum wire can be easily oxidized.

BRIEF DESCRIPTION OF THE DRAWINGS

FIGS. 1(a) through 1(c) show a quantum effect device according to a first embodiment of the invention, wherein FIG. 1(a) is a schematic perspective view thereof, FIG. 1(b) is a sectional view taken on a line along a source and a drain thereof, and FIG. 1(c) shows an energy level on a section taken along the source and the drain;

DETAILED DESCRIPTION OF THE INVENTION (Embodiment 1)

A first embodiment of the invention will now be described with reference to the accompanying drawings.

Figure 1A:
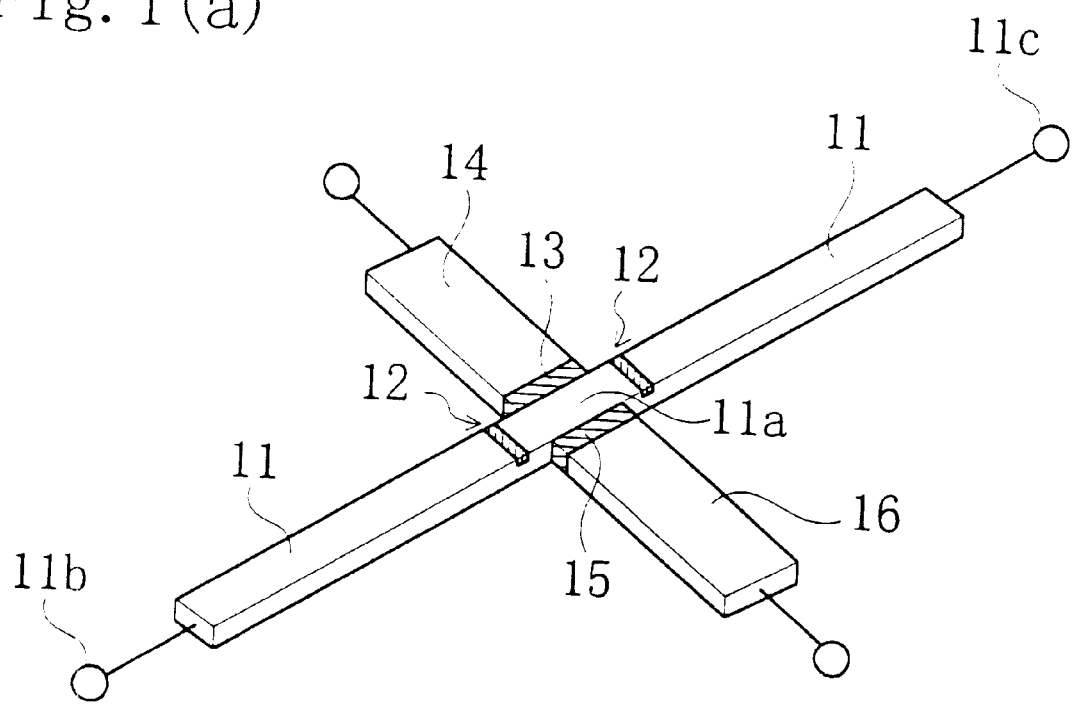

FIG. 1(a) is a schematic perspective view of a quantum effect device according to the first embodiment. As is shown in FIG. 1(a), a silicon island portion 11a is formed on a quantum wire 11 of silicon so as to be sandwiched between a pair of tunnel barrier portions 12 of a silicon oxide film. On one side of the silicon island portion 11a, a gate electrode 14 for potential control is disposed with a gate insulating film 13 of a silicon oxide film interposed between the silicon island portion 11a and the gate electrode 14. On the other side of the silicon island portion 11a, a control electrode 16 for potential control is disposed with an insulating film 15 of a silicon oxide film interposed between the silicon island portion 11a and the control electrode 16.

The quantum wire 11 preferably has a width and a thickness of approximately 10 nm so that the capacitance of the tunnel barrier portions 12 can be sufficiently small. Each tunnel barrier portion 12 is formed by locally oxidizing the quantum wire 11 by 2 nm through 5 nm in the direction along the thickness thereof. The gate insulating film 13 and the insulating film 15 are both of the silicon oxide film, and have a width of 200 nm or less and preferably of several tens nm. The silicon island portion 11a has a width of 10 nm, and a length of 200 nm or less and preferably of several tens nm. The gate electrode 14 and the control electrode 16 are of monocrystalline silicon doped with an n-type impurity at a high concentration, and can be of metal or polycrystalline silicon.

Figure 9A:
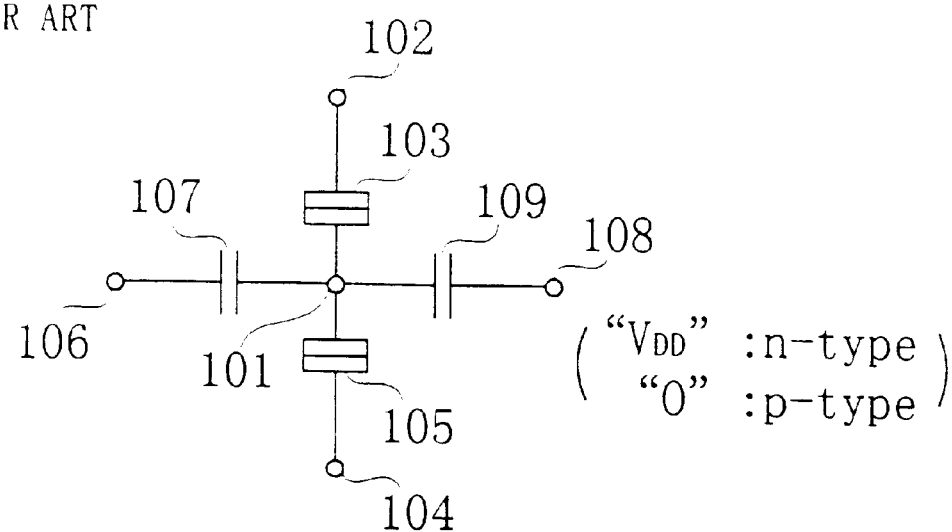
FIG. 9(a) is a schematic circuit diagram of a four-terminal single-electron tunneling device used in a conventional pseudo CMOS single-electron tunneling circuit.
Figure 9B:
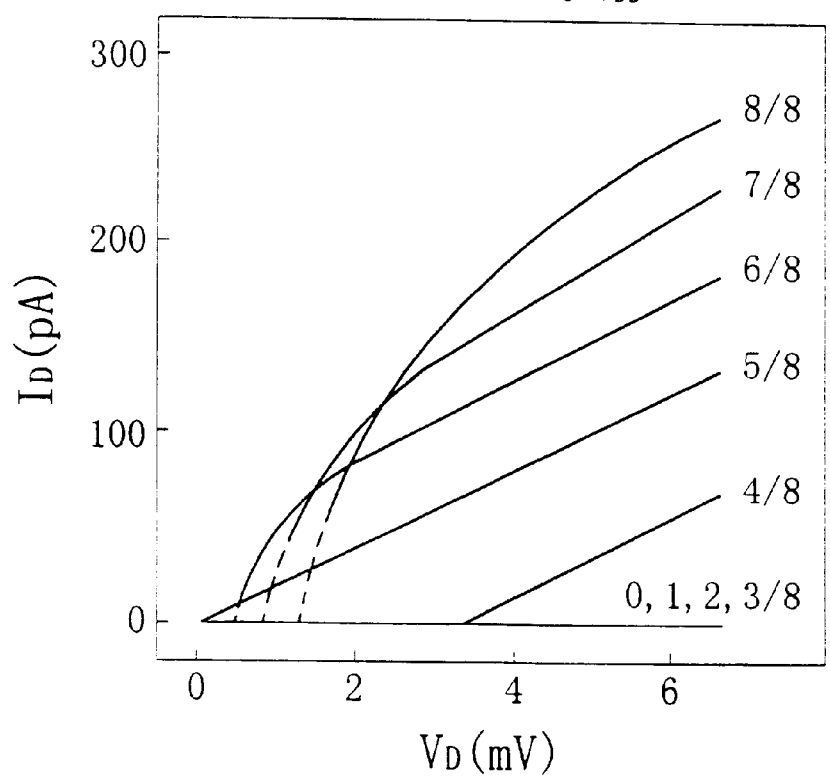
FIG. 9(b) is a graph for showing simulation results of an operation of the conventional four-terminal single-electron tunneling device of FIG. 9(a).

In the quantum effect device of this embodiment, respective ends correspond to the terminals of the four-terminal single-electron tunneling device of the pseudo CMOS single-electron tunneling circuit shown in FIG. 9(a). Specifically, one end 11b of the quantum wire 11 corresponds to the source terminal 104, the other end 11c of the quantum wire 11 corresponds to the drain terminal 102, the gate electrode 14 corresponds to the gate terminal 106 and the control electrode 16 corresponds to the power terminal 108. Accordingly, when a supply potential VDD is applied to the control terminal 16, the quantum effect device works as an n-channel transistor, and when a ground potential is applied to the control electrode 16, the quantum effect device works as a p-channel transistor.

Figure 1B:
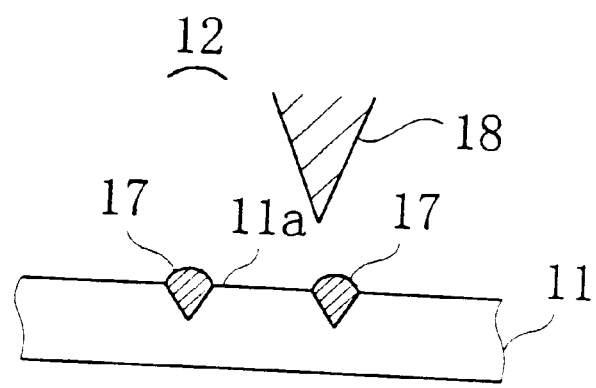

FIG. 1(b) is a sectional view of the quantum effect device of FIG. 1(a) taken on a line along the source and drain thereof. The silicon island portion 11a is formed between a pair of silicon oxide films 17, corresponding to the tunnel barrier portions 12, formed at a distance in the lengthwise direction of the quantum wire 11. Each silicon oxide film 17 is formed from the surface to a substantially center portion in the section of the quantum wire 11, and does not reach the bottom of the quantum wire 11. This structure is designated as a quantum wire constriction structure. Owing to this structure, the driving ability can be prevented from degrading and the speed of a carrier can be increased when a tunnel current flows.

Figure 1C:
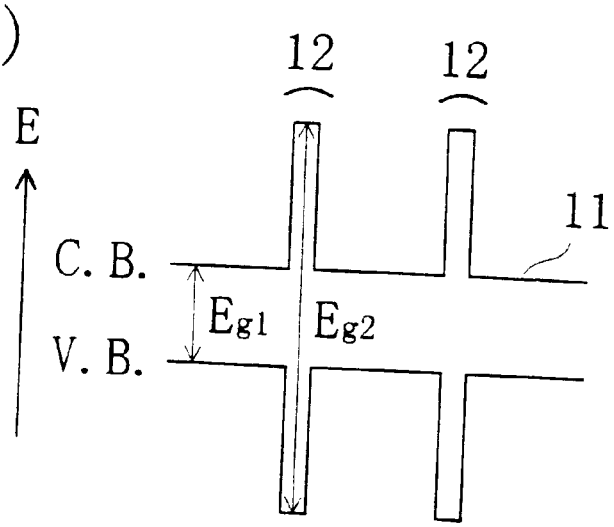

FIG. 1(c) shows an energy level in the section of the quantum wire 11 of FIG. 1(a) taken on the line along the source and the drain. As is shown in FIG. 1(c), owing to the quantum wire constriction structure of the silicon oxide films 17, an energy band gap Eg2 of the tunnel barrier portion 12 is larger than an energy band gap Eg1 of the quantum wire 11. In FIG. 1(c), "C. B." indicates a conduction band and "V. B." indicates a valence band.

In this manner, the quantum effect device of this embodiment enables bit information to be expressed by using several electrons and can realize a pseudo CMOS structure. As a result, a power device with very small power consumption can be realized.

Moreover, the quantum effect device of this embodiment theoretically occupies an area with each side of several tens nm including the silicon island portion 11a, and hence can be very highly integrated.

It is noted that the gate insulating film 13 and the gate electrode 14, and the insulating film 15 and the control electrode 16 are thus designated merely for convenience. Therefore, it goes without saying that the end connected with the gate insulating film 13 can correspond to the power terminal 108 and that the end connected with the control electrode 16 can correspond to the gate terminal 106 because the corresponding materials are the same.

Now, a method of manufacturing the quantum effect device of the first embodiment will be described with reference to FIGS. 2(a) through 2(c) and 3.

Figure 2A:
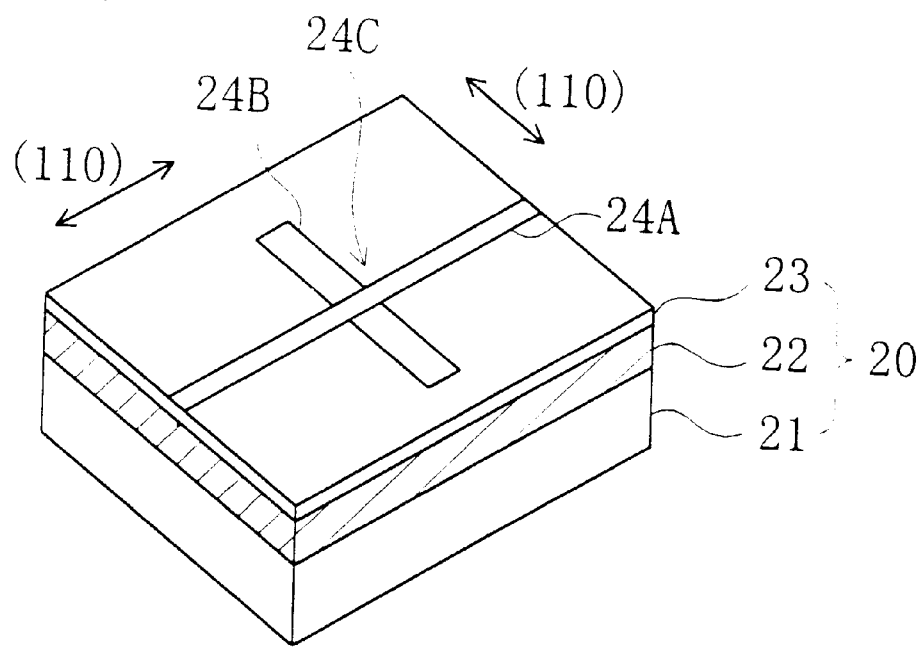
FIGS. 2(a) through 2(c) are perspective views and a sectional view for showing a method of manufacturing the quantum effect device of the first embodiment in the order of procedures.

FIGS. 2(a) through 2(c) and 3 are perspective and sectional views for showing the method of manufacturing the quantum effect device of this embodiment in the order of procedures. First, as is shown in FIG. 2(a), an SOI substrate 20, which includes a silicon substrate 21 with the (001) surface orientation, a buried oxide film 22 with a thickness of 100 nm formed on the silicon substrate 21 and an upper silicon layer (not shown) with a thickness of 140 nm formed on the buried oxide film 22, is oxidized in an atmosphere of oxygen at a temperature of 1000° C. for approximately 120 minutes. An oxide film formed on the upper silicon layer through the oxidization is removed in an aqueous solution of hydrogen fluoride (HF), thereby making the upper silicon layer thinner. Thus, a thin silicon layer 23 with a thickness of 10 nm is formed. By using a scanning probe microscope, such as an atomic force microscope (AFM) and a scanning tunnel microscope (STM), having a conductive tip coated with gold (Au) (merely a tip of which is shown with a reference numeral 18 in FIG. 1(b)), the conductive tip is allowed to come close to a predetermined area on the thin silicon layer 23. Then, while applying a bias voltage of −10 V to the conductive tip, field enhanced oxidation is effected by scanning the thin silicon layer 23 vertically or parallel to the (110) crystal orientation. As a result, a first linear pattern 24A and a second linear pattern 24B, both of a silicon oxide film obtained as a field enhanced oxide film, crossing each other at right angles on a crossing portion 24C are formed.

Figure 2B:
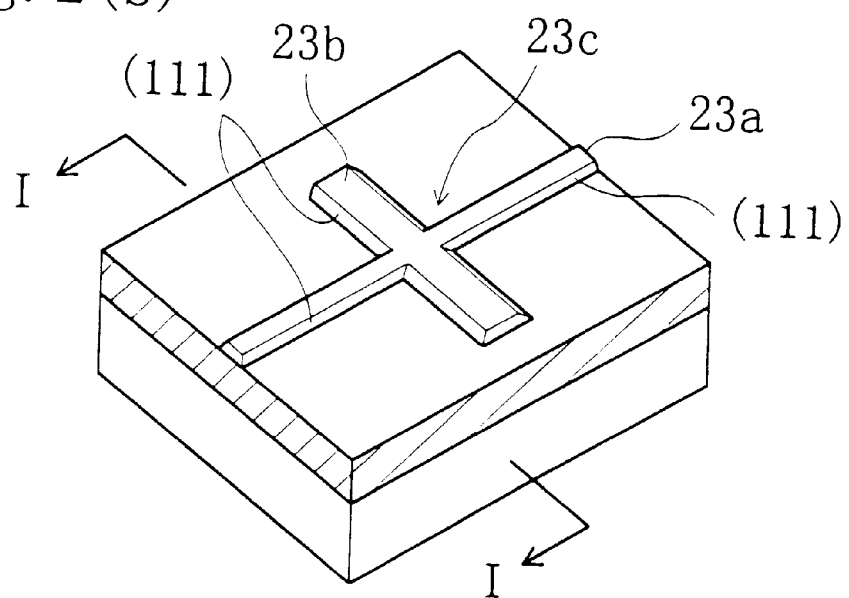
Figure 2C:
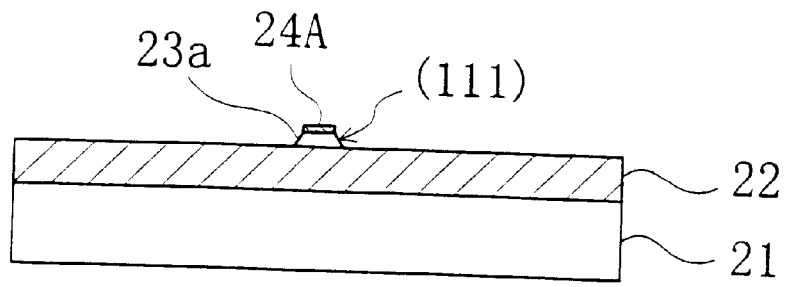

Next, as is shown in FIG. 2(b), by using a mixed solution including 1000 ml of ethylenediamine, 144 g of pyrocatechol and 290 ml of pure water as an etching solution, the SOI substrate 20 is subjected to silicon crystal anisotropic etching for 1 minute, while retaining the temperature of the etching solution at 80° C. In the silicon crystal anisotropic etching, the etching rate on the (111) oriented surface is approximately 8 nm/min. but that on the (100) and (110) oriented surfaces is approximately 100 nm/min. Therefore, as is shown in FIG. 2(c), which is a sectional view taken on line I—I of FIG. 2(b), owing to this etching rate characteristics and etching resistance of the first and second linear patterns 24A and 24B of the silicon oxide film, this wet etching results in forming, on the buried oxide film 22, a silicon fine structure including a first quantum wire 23a and a second quantum wire 23b of silicon, which have the (111) oriented surface as their side faces and cross each other at a crossing portion 23c. Then, the first and second linear patterns 24A and 24B are removed by using hydrofluoric acid or the like.

Figure 3:
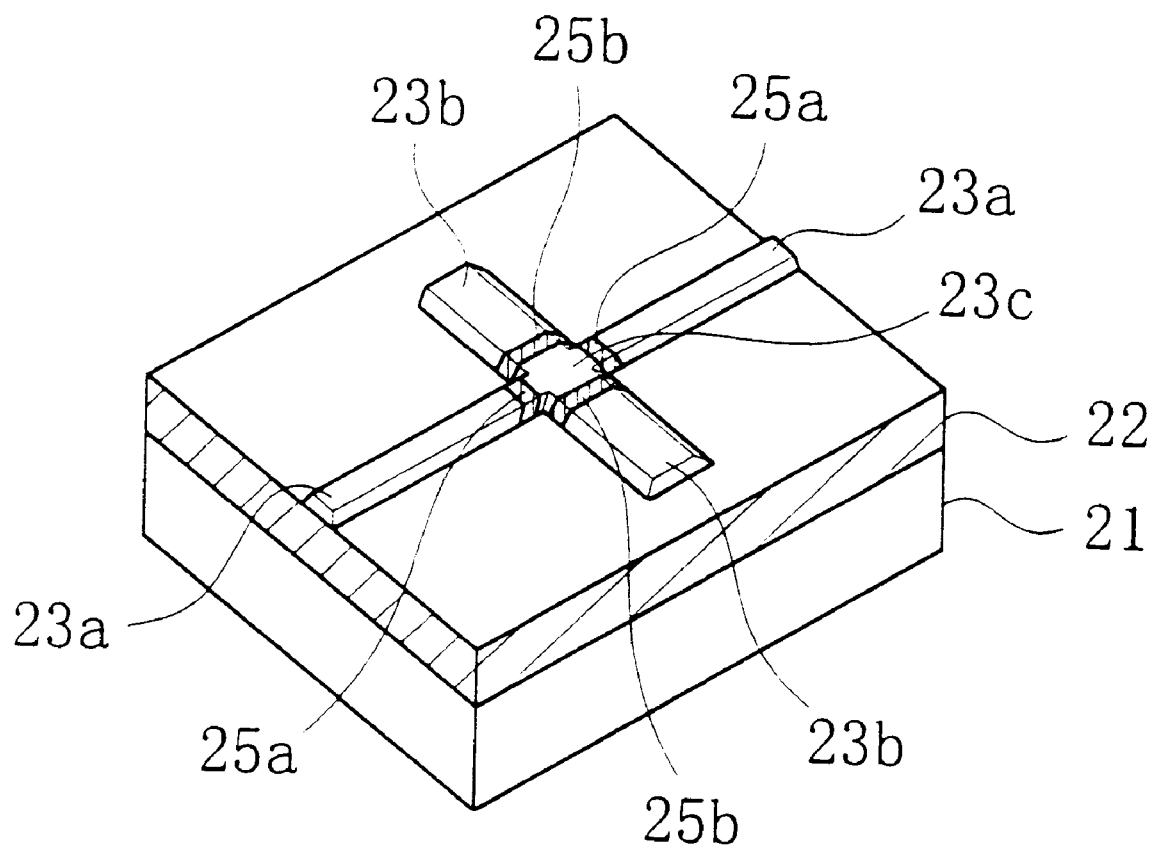
FIG. 3 is a perspective view for showing the method of manufacturing the quantum effect device of the first embodiment in a procedure following that of FIG. 2(c)

Next, as is shown in FIG. 3, the level difference of an area including the first and second quantum wires 23a and 23b on the buried oxide film 22 is measured with the scanning probe microscope, so as to obtain positioning data for writing patterns in a subsequent procedure. Then, while allowing the conductive tip under application of a bias voltage of −10 V to come successively close to first and second areas in the first quantum wire 23a on both sides of the crossing portion 23c, the field enhanced oxidation is effected, thereby forming tunnel barriers 25a of a field enhanced oxide film in the first and second areas. A difference in the thickness of the silicon film, i.e., a conductor, resulting from the field enhanced oxidation leads to a difference in the band gap, which forms a potential barrier. As a result, the crossing portion 23c is sandwiched between the two tunnel barriers 25a in the first quantum wire 23a, and hence, one end of the first quantum wire 23a is provided with a source terminal and the other end thereof is provided with a drain terminal. Since the bias voltage and another parameter applied to the conductive tip of the microscope can be changed, the thickness and the like of the field enhanced oxide film in each tunnel barrier 25a can be changed. Therefore, the capacitance and the tunnel resistance of the tunnel barrier 25a can be changed in accordance with the thickness.

Subsequently, while allowing the conductive tip under application of a bias voltage of −30 V to come successively close to third and fourth areas in the second quantum wire 23b on both sides of the crossing portion 23c, the field enhanced oxidation is effected, thereby forming insulating films 25b of a field enhanced oxide film in the third and fourth areas. Thus, a silicon island portion surrounded by a pair of tunnel barriers 25a and a pair of insulating films 25b can be formed as the crossing portion 23c. In this manner, the second quantum wire 23b is insulated by the two insulating films 25b, and hence, one end of the second quantum wire 23b is provided with a gate electrode for potential control and the other end thereof is provided with a control electrode for potential control.

In this manner, in the method of manufacturing the quantum effect device of this embodiment, the scanning probe microscope is used for writing patterns, and hence, a fine-line process on a several-nm level can be easily carried out.

Furthermore, the capacitance and the resistance of the tunnel barrier, which largely affect the device characteristic and the operational temperature, can be optimized by appropriately selecting the bias condition for the conductive tip used in she field enhanced oxidation. Therefore, the pair of the tunnel barriers 25a sandwiching the crossing portion 23c working as the silicon island portion can be asymmetrically formed. When the pair of tunnel barriers 25a are asymmetrically formed, an output speed can be advantageously increased by, for example, making the capacitance of one tunnel barrier close to the output port smaller than that of the other tunnel barrier close to the input port in accordance with a desired circuit.

Moreover, since the field enhanced oxidation reforms a silicon atom surface alone and the crystal anisotropic etching is a wet process, this method is free from a process damage. Therefore, an offset charge of an interfacial level and the like, which can cause a malfunction of a single-electron tunneling device, can be suppressed to an extremely low level.

Furthermore, since the crystal anisotropic etching is used, the side face of the quantum wire is flat on an atomic level. Therefore, this quantum wire is excellent in width uniformity end linearity in the lengthwise direction, and hence, the electron mobility can be improved owing to the quantum mechanical effect. Thus, the quantum effect device is capable of a high speed operation.

(Embodiment 2)

A second embodiment of the invention will now be described with reference to the accompanying drawings.

Figure 4A:
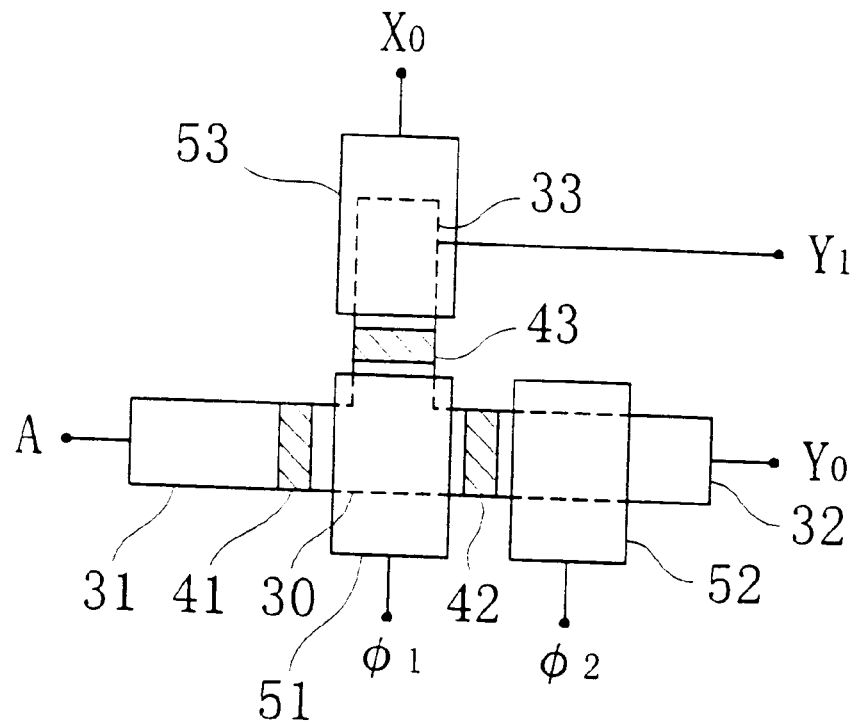
FIG. 4(a) is a partial plan view of a semiconductor device according to a second embodiment.

FIG. 4(a) is a partial plan view of a semiconductor device according to the second embodiment. In FIG. 4(a), on an SOI substrate are formed a carrier transfer portion 30 of silicon, a first quantum wire 31 of silicon electrically connected with one end of the carrier transfer portion 30 with a first tunnel barrier 41 interposed therebetween, a second quantum wire 32 of silicon electrically connected with the other end of the carrier transfer portion 30 with a second tunnel barrier 42 interposed therebetween, and a third quantum wire 33 of silicon electrically connected with a side portion between the two ends of the carrier transfer portion 30 with a third tunnel barrier 43 interposed therebetween.

Also, a first gate electrode 51, working as a control electrode, is formed on the carrier transfer portion 30 with an insulating film (not shown) sandwiched therebetween, a second gate electrode 52 is formed on the second quantum wire 32 with an insulating film (not shown) sandwiched therebetween, and a third gate electrode 53 is formed on the third quantum wire 33 with an insulating film (not shown) sandwiched therebetween.

Each of the carrier transfer portion 30 and the first through third quantum wires 31 through 33 has a width of 100 nm or less and is conductive. The first through third tunnel barriers 41 through 43 work as energetic barriers, and are not limited in their materials as far as they can allow a tunnel current to flow therethrough. The first through third gate electrodes 51 through 53 are not limited in their materials as far as a potential can be transferred therethrough.

The first quantum wire 31 is used as a signal input part, and its input voltage is indicated as a voltage A. The second quantum wire 32 is used as a first output detecting part, and its output voltage is indicated as a voltage Y0. The third quantum wire 33 is used as a second output detecting part, and its output voltage is indicated as a voltage Y1. The third gate electrode 53 is used as a signal control electrode, and its control potential is indicated as a potential X0. The first gate electrode 51 and the second gate electrode 52 are used as clock control electrodes, and their control potentials are indicated as potentials $\phi 1$ and $\phi 2$, respectively.

Figure 4B:
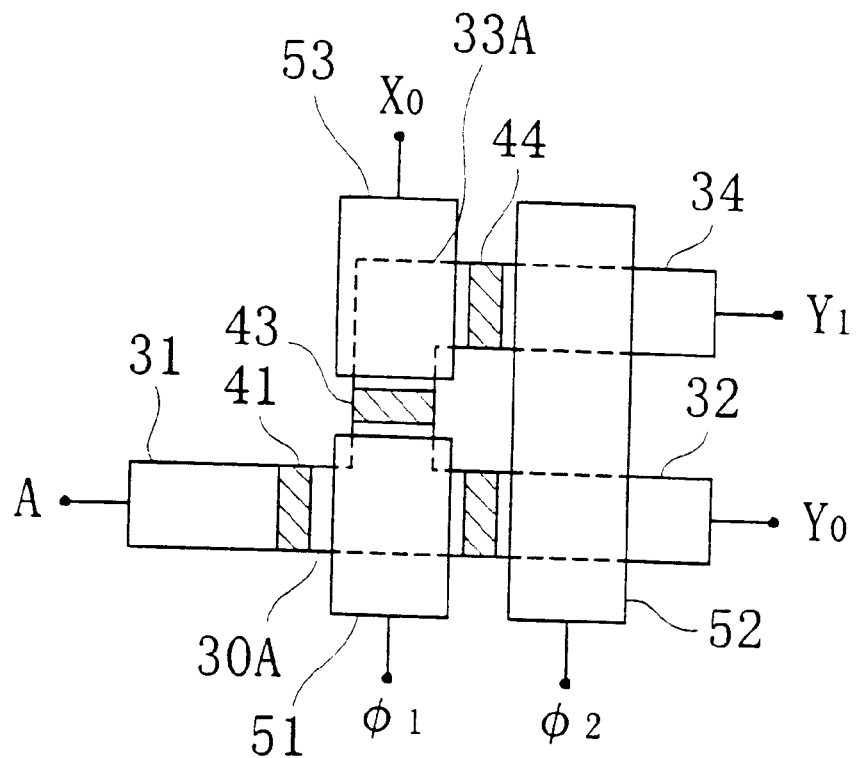
FIG. 4(b) is a partial plan view of a semiconductor device according to first modification of the second embodiment.

FIG. 4(b) is a partial plan view of a semiconductor device according to first modification of the second embodiment. In FIG. 4(b), on an SOI substrate are formed a first carrier transfer portion 30A of silicon, a first quantum wire 31 of silicon electrically connected with one end of the first carrier transfer portion 30A with a first tunnel barrier 41 interposed therebetween, a second quantum wire 32 of silicon electrically connected with the other end of the first carrier transfer portion 30A with a second tunnel barrier 42 interposed therebetween, a second carrier transfer portion 33A of silicon electrically connected with a side portion between the two ends of the first carrier transfer portion 30A with a third tunnel barrier 43 interposed therebetween, and a third quantum wire 34 of silicon electrically connected with a side portion, on the same side as the second quantum wire 32, of the second carrier transfer portion 33A with a fourth tunnel barrier 44 interposed therebetween.

Also, a first gate electrode 51 is formed on the first carrier transfer portion 30A with an insulating film (not shown) sandwiched therebetween, a second gate electrode 52 is formed on the second quantum wire 32 and the third quantum wire 34 with an insulating film (not shown) sandwiched therebetween, and a third gate electrode 53 is formed on the second carrier transfer portion 33A with an insulating film (not shown) sandwiched therebetween.

Each of the first and second carrier transfer portions 30A and 33A and the first through third quantum wires 31, 32 and 34 has a width of 0.1 $\mu$m or less and is conductive. The first through fourth tunnel barriers 41 through 44 work as energetic barriers, and are not limited in their materials as far as a tunnel current can flow therethrough. The first through third gate electrodes 51 through 53 are not limited in their materials as far as a potential can be transferred therethrough.

The first quantum wire 31 is used as a signal input part, and its input voltage is indicated as a voltage A. The second quantum wire 32 is used as a first output detecting part and its output voltage is indicated as a voltage Y0, and the third quantum wire 34 is used as a second output detecting part and its output voltage is indicated as a voltage Y1. The third gate electrode 53 is used as a signal control electrode, and its control potential is indicated as a potential X0. The first and second gate electrodes 51 and 52 are used as clock control electrodes, and their control potentials are indicated as potentials $\phi 1$ and $\phi 2$, respectively.

Figure 5:
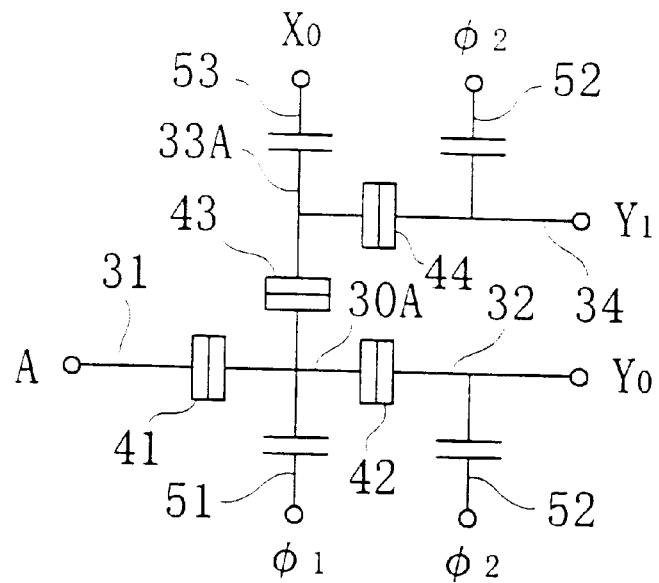
FIG. 5 is an equivalent circuit diagram of the semiconductor device according to the first modification of the second embodiment.

FIG. 5 is an equivalent circuit diagram of the semiconductor device according to the first modification of the second embodiment. The first carrier transfer portion 30A is surrounded with the first tunnel barrier 41, the second tunnel barrier 42 and the third tunnel barrier 43, and the second carrier transfer portion 33A is surrounded with the third tunnel barrier 43 and the fourth tunnel barrier 44. Therefore, when an electron is contained in the first carrier transfer portion 30A or the second carrier transfer portion 33A, another electron cannot be contained due to the Coulomb interaction between the electrons. Furthermore, when an appropriate low potential is applied to the first gate electrode 51 or the third gate electrode 53, the electron cannot flow out of the first carrier transfer portion 30A or the second carrier transfer portion 33A. When an electron exists in the first quantum wire 31, this electron in the first quantum wire 31 can be transferred to the first carrier transfer portion 30A by applying an appropriate high potential to the first gate electrode 51. At this point, by applying a higher potential to the third gate electrode 53, the electron having been transferred to the first carrier transfer portion 30A is further transferred to the second carrier transfer portion 33A.

Figure 6:
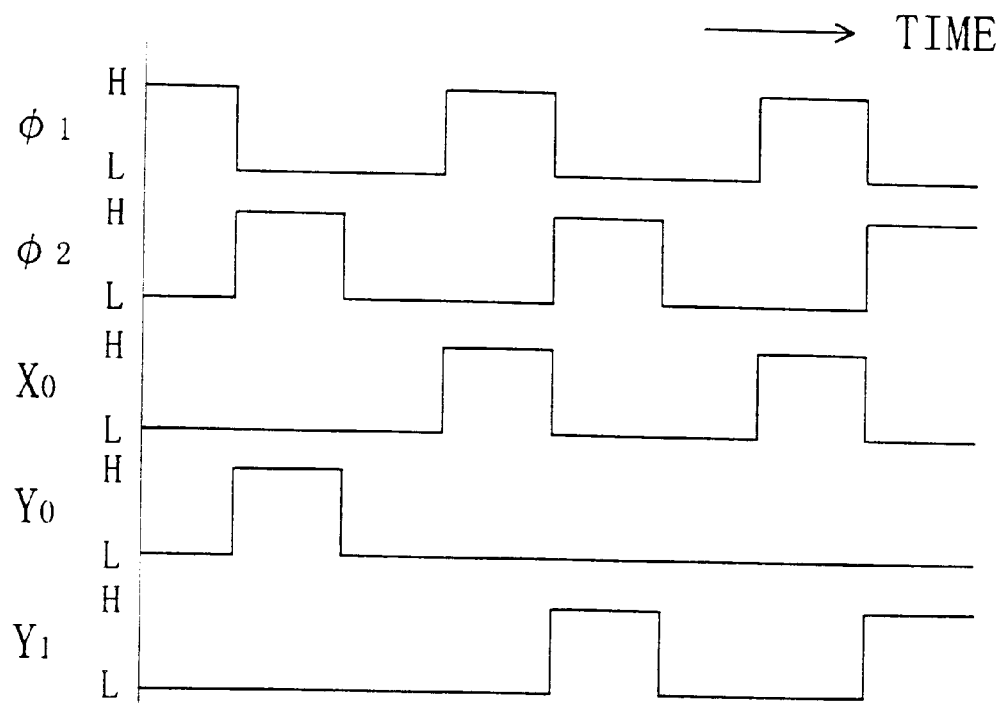
FIG. 6 is a timing chart for showing respective control voltages in the semiconductor device according to the first modification of the second embodiment.

FIG. 6 is a timing chart of respective control voltages in the semiconductor device according to the first modification of the second embodiment. When the control potentials φ1, φ2 and X0 are applied to the first through third gate electrodes 51 through 53, respectively at timing shown in FIG. 6, charges are exclusively output to the output voltage Y0 of the first output detecting part and the output voltage Y1 of the second output: detecting part, respectively.

As a result, in the circuit of this embodiment, while the control potential X0 is at a high level, the charge of the input voltage A can be transferred to the second output detecting part as the output voltage Y1, and when the control potential X0 is at a low level, the charge can be transferred to the first output detecting part as the output voltage Y0. Thus, the circuit is formed as a binary decision diagram circuit.

Accordingly, in this embodiment, a binary decision diagram circuit can be easily and definitely formed by a single-electron tunneling transistor utilizing quantum wires.

Silicon is used as the material for the quantum wires in this embodiment, but the material is not limited to silicon but can be any conductive material. The tunnel barrier works as the energetic barrier, and can be of any material which allow a tunnel current to flow, such as a thin silicon oxide film and a quantum wire constriction structure obtained by oxidizing the periphery of a quantum wire. The material for the gate electrode is generally aluminum or the like for consistency with a silicon multi-layer interconnecting process, but can be any material that can transfer a potential.

(Embodiment 3)

A third embodiment of the invention will now be described with reference to the accompanying drawings.

Figure 7:
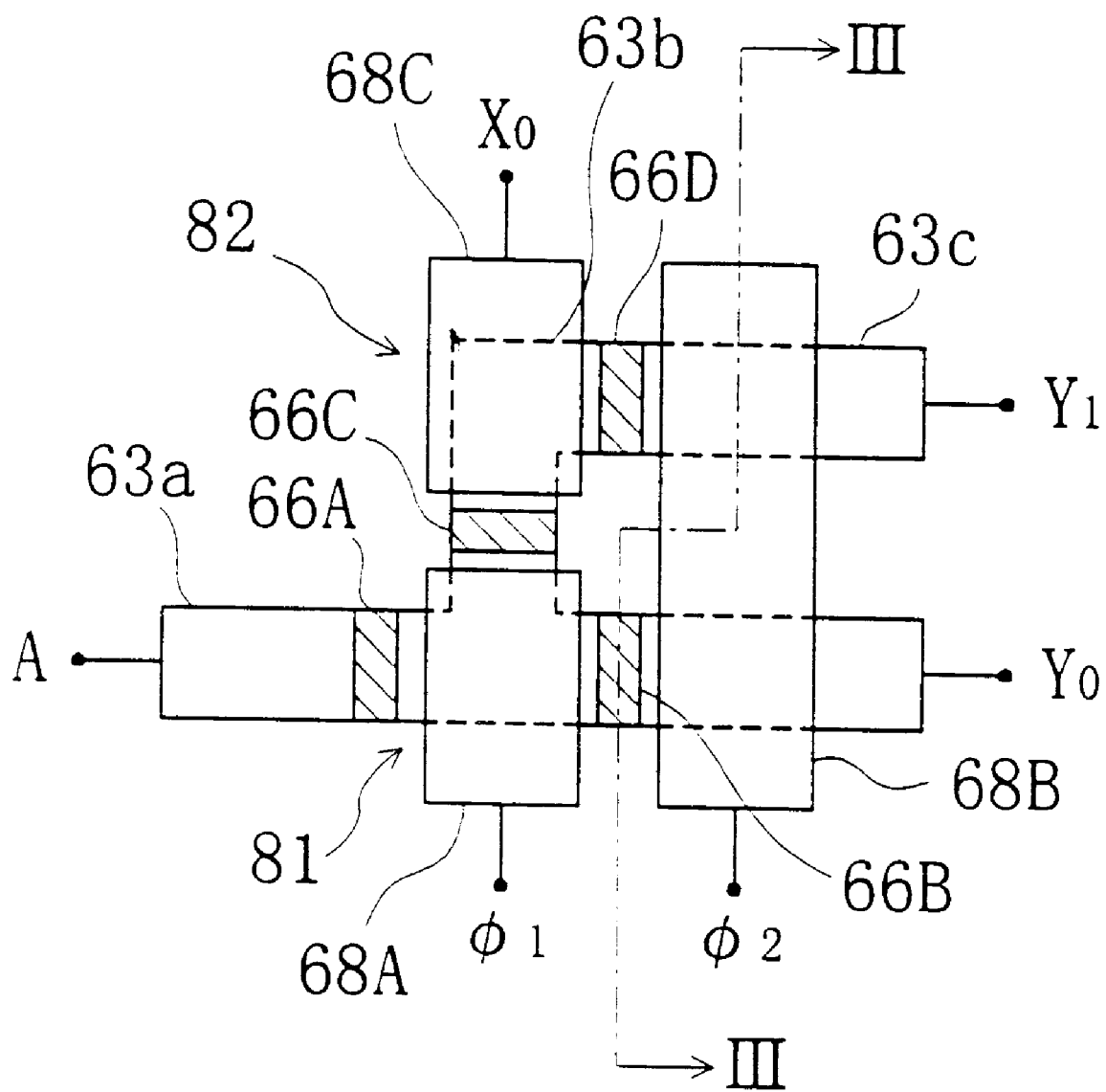
FIG. 7 is a partial plan view of a semiconductor device according to a third embodiment.

FIG. 7 is a partial plan view of a semiconductor device according to the third embodiment. FIGS. 8(*a*) through 8(*f*) are sectional views taken on line III—III of FIG. 7 for showing a method of manufacturing the semiconductor device in the order or procedures. First, as is shown in FIG. 8(*a*), an SOI substrate 60, including a silicon substrate 61, a buried oxide film 62 with a thickness of 80 nm formed on the silicon substrate 61, and an upper silicon layer 63A having a thickness of 180 nm and the main surface of the (100) orientation formed on the buried oxide film 62, is formed by, for example, an SIMOX method.

Next, as is shown in FIG. 8(*b*), the SOI substrate 60 is oxidized in an atmosphere of oxygen at a temperature of 1000° C. for approximately 120 minutes, and an oxide film formed on the upper silicon layer 63A through the oxidation is removed in an aqueous solution of hydrogen fluoride (HF). Thus, the upper silicon layer 63A is made thinner, thereby forming a thin silicon layer 63B with a thickness of 50 nm.

Subsequently, as is shown in FIG. 8(*c*), by using a scanning probe microscope, such as an atomic force microscope (AFM) and a scanning tunnel microscope (STM), having a conductive tip 90 coated with gold (Au) or the like, the conductive tip 90 is allowed to come close to a predetermined area of the main surface of the thin silicon layer 63B, where a first linear pattern is to be formed. Then, under application of a ground potential to the conductive tip 90 and a bias voltage of +9 V to the thin silicon layer 63B, the conductive tip 90 is linearly moved along the main surface of the thin silicon layer 63B at a velocity of approximately 0.25 μm/sec., thereby effecting a field enhanced oxidation using an electric field applied to the thin silicon layer 63B. Thus, a silicon oxide film 65A, i.e., the first linear pattern, is formed on the surface of the thin silicon layer 63B as a field enhanced oxide film with a width of approximately 100 nm and a thickness of 5 nm. Subsequently, a second linear pattern, which extends from a first branching portion (shown with a reference numeral 81 in FIG. 7), corresponding to a first carrier transfer portion in the first linear pattern, vertically to the first straight line patter on the main surface, is formed by using the field enhanced oxidation. Also, a silicon oxide film 65C, i.e., a third linear pattern, which extends from a second branching portion (shown with a reference numeral 82 in FIG. 7), corresponding to a second carrier transfer portion in the second linear pattern, vertically to the second linear pattern and parallel to the first linear pattern on the main surface, is formed similarly by the field enhanced oxidation.

Next, as is shown in FIG. 8(*d*), by using a mixed solution including 300 ml of ethylenediamine, 48 g of pyrocatechol and 98 ml of pure water as an etching solution, the SOI substrate 60 is subjected to an anisotropic etching for 30 seconds, while retaining the temperature of the etching solution at 80° C. This etching solution etches silicon, but has different etching rates depending upon the surface orientations, and has very small etching rate on the (111) oriented surface as compared with surfaces of the other orientations. Accordingly, after soaked with the etching solution for 30 seconds, the thin silicon layer 63B remains merely below the silicon oxide films 65A, 65C and the like. Thus, a first quantum wire 63*a*, a second quantum wire (shown with a reference numeral 63*b* in FIG. 7), and a third quantum wire 63*c* are formed. Each of the quantum wires 63*a*, 63*b* and 63*c* has the (111) oriented surface as their side faces. At this point, the upper faces of the quantum wires 63*a*, 63*b* and 63*c* are protected by the silicon oxide films 65A, etc., and cannot be etched.

Next, as is shown in FIG. 8(*e*), the conductive tip 90 is allowed to come close to a first area in the first quantum wire 63*a*, on one side of the first branching portion 81 opposite to the third quantum wire 63*c*. Under application of a ground potential to the conductive tip 90 and a bias voltage of +15 V to the first: quantum wire 63*a*, the conductive tip 90 is moved vertically to the first quantum wire 63*a* along the surface of the first quantum wire 63*a* at a velocity of approximately 0.25 μm/sec. Thus, a barrier oxide film working as a first tunnel barrier (shown with a reference numeral 66A in FIG. 7) with a thickness and a width of approximately 10 nm is formed in the first area through the field enhanced oxidation using the applied electric field. Similarly, the conductive tip 90 is allowed to come close to a second area in the first quantum wire 63*a*, on the other side of the first branching portion 81 the same as the third quantum wire 63*c*, and the field enhanced oxidation is effected. Thus, a barrier oxide film 66B working as a second tunnel barrier of a field enhanced oxide film is formed in the second area. Subsequently, the conductive tip 90 is also similarly allowed to come close to a third area in the second quantum wire 63*b* on one side of the second branching portion 82 close to the first branching portion 81, and the field enhanced oxidation is effected. Thus, a barrier oxide film working as a third tunnel barrier (shown with a reference numeral 66C in FIG. 7) of a field enhanced oxide film is formed in the third area. Also, the conductive tip 90 is allowed to come close to a fourth area in the third quantum wire 63c on one side of the second branching portion 82, and the field enhanced oxidation is effected. Thus, a barrier oxide film working as a fourth tunnel barrier (shown with a reference numeral 66D in FIG. 7) of a field enhanced oxide film is formed in the fourth area.

Figure 8A:
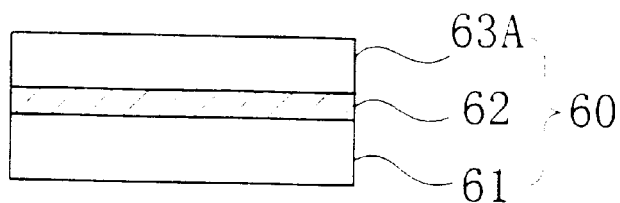
FIGS. 8(a) through 8(f) are sectional views taken on line III—III of FIG. 7 for showing a method of manufacturing the semiconductor device of the third embodiment in the order of procedures.
Figure 8B:
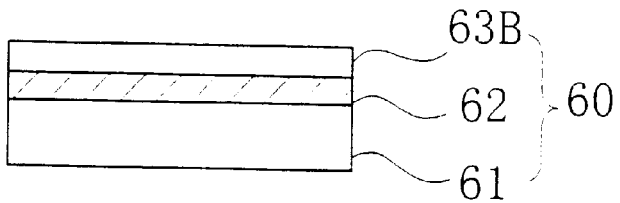
Figure 8C:
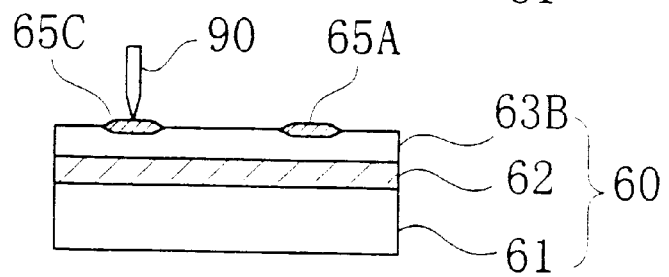
Figure 8D:
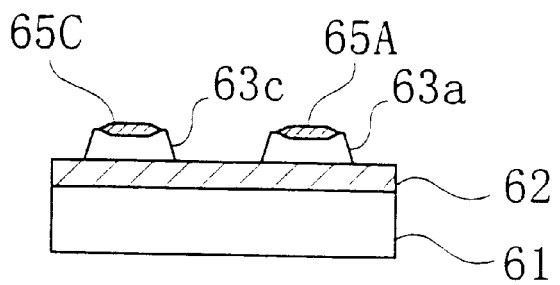
Figure 8E:
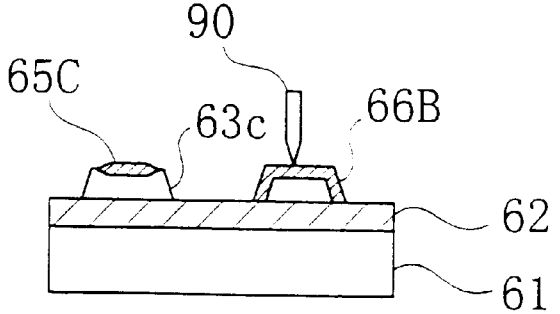
Figure 8F:
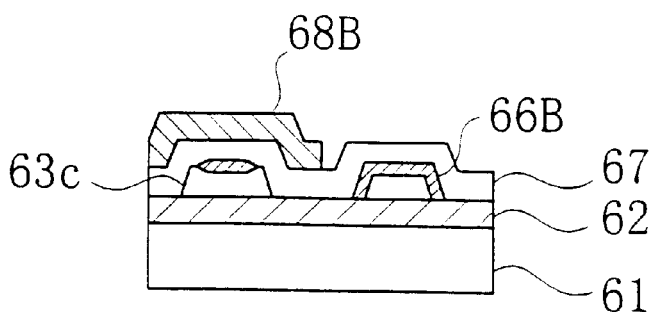

Next, as is shown in FIG. 8(f), by using, for example, an atmospheric CVD, a silicon oxide film 67 working as an interlayer insulating film with a thickness of 100 nm is deposited on the entire surface of the SOI substrate 60. Then, an aluminum thin film with a thickness of 500 nm is further deposited on the entire surface of the silicon oxide film 67 by the sputtering method. The aluminum thin film is then selectively etched by the photolithography. In this manner, a first gate electrode (shown with a reference numeral 68A in FIG. 7) is formed on the first branching portion 81, a second gate electrode (shown with a reference numeral 68B in FIG. 7) is formed on a portion of the first quantum wire 63a on the same side of the barrier oxide film 66B as the third quantum wire 63c and also on the third quantum wire 63c, and a third gate electrode 68C is formed on the second branching portion 82.

In this manner, also in this embodiment, a semiconductor device including a single-electron tunneling transistor using quantum wires can be definitely manufactured in the same configuration as that of the semiconductor device realizing the binary decision diagram circuit according to the first modification of the second embodiment.

Furthermore, since the scanning probe microscope is used for writing patterns, a fine-line process on a several-nm level can be easily carried out. Also, the capacitance and the resistance of the tunnel barrier, which can largely affect the device characteristic and the operational temperature, can be optimized by appropriately selecting the bias condition for the conductive tip used in the field enhanced oxidation.

Moreover, since the field enhanced oxidation reforms a silicon atom surface alone and the crystal anisotropic etching is a wet process, the method of this embodiment is free from a process damage. Accordingly, an offset charge of an interfacial level and the like, which can cause a malfunction of a single-electron tunneling device, can be suppressed to a very low level.

In addition, since the crystal anisotropic etching is used, the side face of each quantum wire is flat on an atomic level, and hence the quantum wire is excellent in width uniformity and linearity in the lengthwise direction. Accordingly, the electron mobility can be improved due to the quantum mechanical effect. As a result, the device of this embodiment is capable of a high speed operation.

Silicon is used as the material for the quantum wires in this embodiment, but the material is not limited to silicon but can be any conductive material.

Furthermore, in this embodiment, the barrier oxide film is formed by using the so-called quantum wire constriction structure, in which the quantum wire is not completely oxidized but merely the peripheral thereof is oxidized. However, when each quantum wire is further minimized in its width, the quantum wire can be completely oxidized. In this case, a leakage current in the device can be suppressed, and a cooling temperature of the device can be comparatively high. Each barrier oxide film works as an energetic barrier, and is not limited in its material as far as a tunnel current can flow. For example, a thin silicon oxide film, a fine-line constriction structure obtained by oxidizing the periphery of a quantum wire, or the like can be used as the barrier oxide film.

Also, as the material for the gate electrodes, aluminum is used in this embodiment for consistency with a silicon multi-layer interconnecting process. However, it goes without saying that the material is not limited to aluminum as far as a potential can be transferred.

Furthermore, as the material for the conductive tip, silicon coated with gold is generally used, but the conductive tip can be of tungsten, silicon with an impurity diffused, or the like.

The mixed aqueous solution including ethylenediamine and pyrocatechol is used in the anisotropic etching in this embodiment, but any other solution such as potassium hydroxide (KOH) and tetramethylammonium hydroxide (TMAH) can be used as far as an etching rate in a specific surface orientation is much lower than in other orientations. In using another etching solution, it goes without saying that the orientation of the main surface is required to be changed in accordance with the anisotropy of the used solution.

What is claimed is:

1. A method of manufacturing a quantum effect device comprising the steps of:

forming a thin silicon layer by making an upper silicon layer on an SOI substrate thinner through etching of an entire main surface of said upper silicon layer;

forming a first linear pattern of a field enhanced oxide film on said thin silicon layer by allowing a conductive tip to come close to a main surface of said thin silicon layer and effecting a field enhanced oxidation by scanning, with said conductive tip, the main surface of said thin silicon layer in a direction parallel to one side of said SOI substrate;

forming, on said thin silicon layer, a second linear pattern of a field enhanced oxide film crossing said first linear pattern at a crossing portion by allowing said conductive tip to come close to a predetermined area in said first linear pattern and effecting the field enhanced oxidation by scanning, with said conductive tip, the main surface of said thin silicon layer in a direction vertical to said first linear pattern;

forming a first quantum wire and a second quantum wire of silicon crossing each other at a crossing portion by effecting anisotropic etching on said thin silicon layer by using said first and second linear patterns as masks;

after removing said first and second linear patterns, forming tunnel barriers of a field enhanced oxide film in first and second areas in said first quantum wire sandwiching said crossing portion by effecting the field enhanced oxidation with said conductive tip allowed to come successively close to said first and second areas; and forming insulating films of a field enhanced oxide film in third and fourth areas in said second quantum wire sandwiching said crossing portion by effecting the field enhanced oxidation with said conductive tip allowed to come successively close to said third and fourth areas.

2. A method of manufacturing a semiconductor device comprising the steps of:

forming a thin silicon film by making an upper silicon layer on an SOI substrate thinner through etching of an entire main surface of said upper silicon layer;

forming a first linear pattern of a field enhanced oxide film on said thin silicon layer by allowing a conductive tip to come close to a main surface of said thin silicon layer and effecting a field enhanced oxidation by scanning, with said conductive tip, the main surface of said thin silicon layer in a direction parallel to one side of said SOI substrate;

forming, on said thin silicon layer, a second linear pattern of a field enhanced oxide film connected with said first linear pattern through a first branching portion by allowing said conductive tip to come close to a predetermined area in said first linear pattern and effecting the field enhanced oxidation by scanning, with said conductive tip, the main surface of said thin silicon layer in a direction vertical to said first linear pattern;

forming, on said thin silicon layer, a third linear pattern of a field enhanced oxide film connected with said second linear pattern through a second branching portion by allowing said conductive tip to come close to a predetermined area in said second linear pattern and effecting the field enhanced oxidation by scanning, with said conductive tip, the main surface of said thin silicon layer in a direction vertical to said second linear pattern;

forming a first quantum wire and a second quantum wire of silicon connected with each other through said first branching portion and a third quantum wire of silicon connected with said second quantum wire through said second branching portion by effecting anisotropic etching on said thin silicon layer by using said first, second and third linear patterns as masks;

forming a first tunnel barrier of a field enhanced oxide film in a first area in said first quantum wire on one side of said first branching portion opposite to said third quantum wire by effecting the field enhanced oxidation with said conductive tip allowed to come close to said first area;

forming a second tunnel barrier of a field enhanced oxide film in a second area in said first quantum wire on the same side of said first branching portion as said third quantum wire by effecting the field enhanced oxidation with said conductive tip allowed to come close to said second area;

forming a third tunnel barrier of a field enhanced oxide film in a third area in said second quantum wire on the same side of said second branching portion as said first branching portion by effecting the field enhanced oxidation with said conductive tip allowed to come close to said third area;

forming a fourth tunnel barrier of a field enhanced oxide film in a fourth area in said third quantum wire on one side of said second branching portion by effecting the field enhanced oxidation with said conductive tip allowed to come close to said fourth area;

depositing an interlayer insulating film on an entire surface of said SOI substrate;

forming a first control electrode on said interlayer insulating film above said first branching portion;

forming a second control electrode on said interlayer insulating film above a part of said first quantum wire on the same side of said second tunnel barrier as said third quantum wire and above said third quantum wire; and forming a third control electrode on said interlayer insulating film above said second branching portion.

3. The method of manufacturing a semiconductor device of claim 2, wherein each of said first, second, third and fourth tunnel barriers is formed by completely oxidizing a section of said corresponding quantum wire.

4. The method of manufacturing a semiconductor device of claim 3, wherein said thin silicon layer on said SOI substrate has a thickness of 50 nm or less.

5. The method of manufacturing a semiconductor device of claim 2, wherein each of said first, second, third and fourth tunnel barriers is formed by partly oxidizing a section of said corresponding quantum wire.

6. The method of manufacturing a semiconductor device of claim 5, wherein said thin silicon layer on said SOI substrate has a thickness of 50 nm or less.

* * * * *